(12) United States Patent
Araki

(10) Patent No.: US 6,525,418 B2
(45) Date of Patent: Feb. 25, 2003

(54) SEMICONDUCTOR DEVICE

(75) Inventor: Chihiro Araki, Shuuchi-gun (JP)

(73) Assignee: Kabushiki Kaisha MORIC, Mori-machi (JP)

( * ) Notice: Subject to any disclaimer, the term of this patent is extended or adjusted under 35 U.S.C. 154(b) by 0 days.

(21) Appl. No.: 10/063,902

(22) Filed: May 22, 2002

(65) Prior Publication Data

US 2002/0180065 A1 Dec. 5, 2002

(30) Foreign Application Priority Data

May 30, 2001 (JP) .................................. 2001-161745

(51) Int. Cl.⁷ .......................... H01L 23/10; H01L 23/34
(52) U.S. Cl. .................... 257/707; 257/706; 257/787; 257/747
(58) Field of Search ........................... 257/787, 747, 257/706, 707

(56) References Cited

U.S. PATENT DOCUMENTS

| | | | | |
|---|---|---|---|---|
| 4,604,642 A | * | 8/1986 | Sakurai | |
| 5,721,455 A | * | 2/1998 | Takashita | |
| 5,736,786 A | * | 4/1998 | Sankaran et al. | |
| 5,771,157 A | * | 6/1998 | Zak | |
| 5,982,631 A | * | 11/1999 | Bowles et al. | |
| 6,242,801 B1 | * | 6/2001 | Sano | |

FOREIGN PATENT DOCUMENTS

JP      7-249714     9/1995

* cited by examiner

*Primary Examiner*—Sheila V. Clark
(74) *Attorney, Agent, or Firm*—Ernest A. Beutler

(57) ABSTRACT

A rotating electrical machine control embodying a circuit including semiconductor devices mounted on a conductive pattern formed on a metal substrate without using heat sinks. Performance is improved as is durability by matching the linear expansion coefficient of the resin used to seal the semiconductor chips with that of the conductive pattern formed on the metal substrate.

4 Claims, 4 Drawing Sheets

SEMICONDUCTOR DEVICE

BACKGROUND OF INVENTION

This invention relates to a circuit comprised of an insulated metal substrate on which a semiconductor bare chip is mounted and more particularly to an improvement in thermal dissipation from the bare chip.

Circuits embodying semiconductor devices are used as control circuits for various types of electronic equipment and devices and in vehicle and industrial equipment and devices. The circuit takes the form of a bare chip is mounted on the electrodes or circuit pattern formed on an insulated substrate. This improves performance by reducing resistance by shortening the wire length. It also permits higher efficiency in the manufacturing process and higher mounting density to reduce size. Generally the bare chip is soldered to the electrodes or circuit pattern on the substrate and then sealed with resin.

In such semiconductor circuits, thermal stress is generated by the difference in thermal expansion and/or shrinkage between the semiconductor chip and the substrate. This is generated by the heat developed in the semiconductor chip itself and temperature cycling of the ambient environment. To reduce such thermal stress, the semiconductor chip is soldered to the substrate via a heat sink formed from a highly conductive plate member, such as copper. However, use of such a heat sinks increase the number of parts, cause the structure to become complicated, reduce the density of chip mounting and increase the difficulty and expense in assembly process.

A circuit including a semiconductor device intended to reduce thermal stress without such a heat sink is disclosed in Japanese Publication 07-249714. The semiconductor device described in that publication is a complex circuit embodying a semiconductor device. The circuit comprises an aluminum substrate on which a conductive pattern is formed via an insulating layer. A semiconductor chip is directly soldered on the conductive pattern, and then sealed with resin having a coefficient of thermal expansion smaller than that of the aluminum substrate.

However, the resin for sealing the semiconductor chip has a lower coefficient of thermal expansion that of the aluminum substrate. Therefore, it is not always possible to obtain sufficient reduction in thermal stress for all types of semiconductor chips and of materials of conductive patterns.

It is therefore a principle object of this invention to provide a circuit embodying a semiconductor device which reduces the thermal stress in the semiconductor chip and without a heat sink.

SUMMARY OF INVENTION

This invention is adapted to be embodied in a circuit comprising a metal substrate, an insulating layer on the substrate and a conductive pattern formed on the insulating layer. A semiconductor bare chip is mounted directly onto the conductive pattern without a heat sink. A sealing body is formed over the semiconductor bare chip. The sealing body is formed from a material having a thermal expansion coefficient approximately equal to that of the conductive pattern.

DETAILED DESCRIPTION

Figure 1:
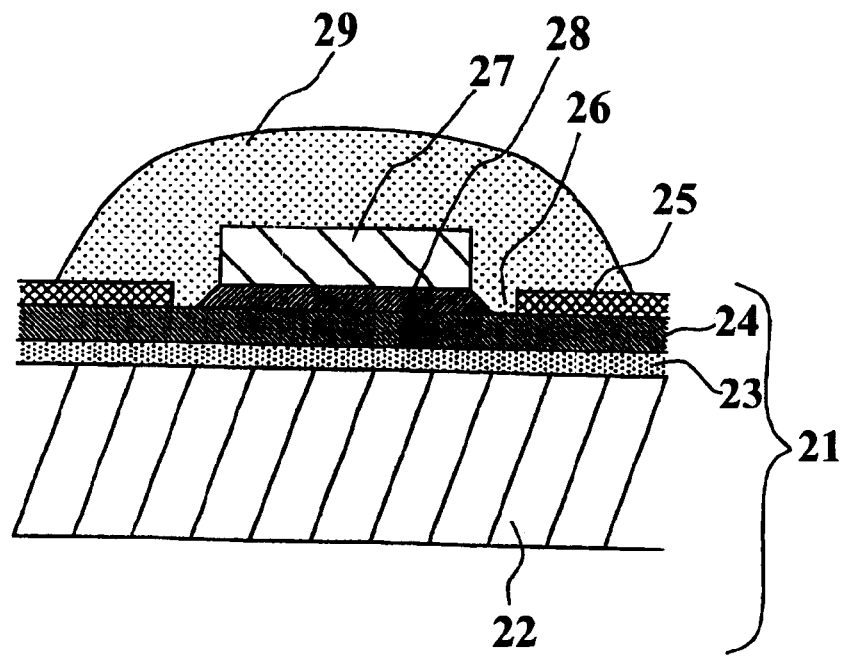
FIG. 1 is a cross sectional view of a circuit constructed in accordance with the invention taken through the center of one of the mounted semiconductor devices.
Figure 2:
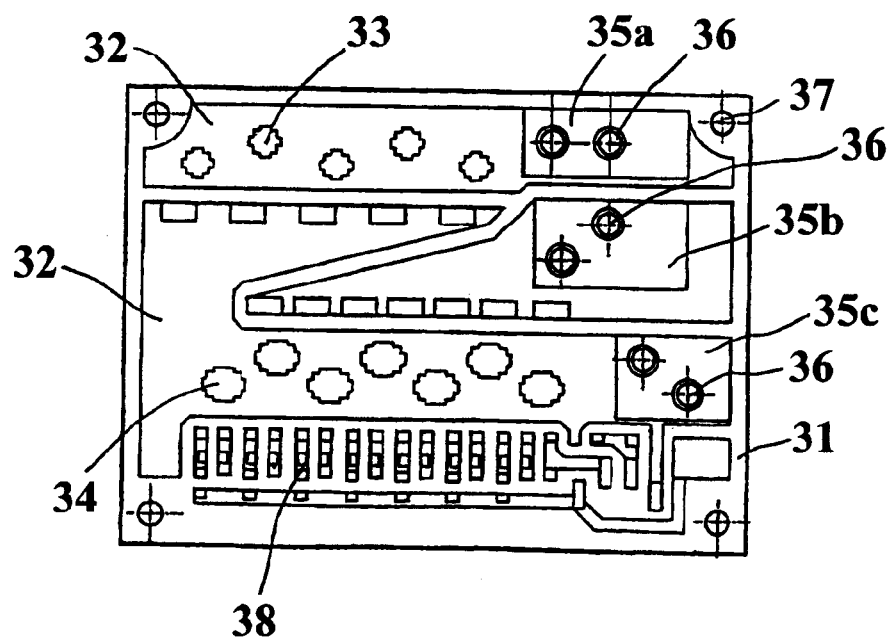
FIG. 2 is a top plan view of an aluminum substrate to which the present invention is applied.

Referring now in detail to the drawings and initially to FIGS. 1–4 a circuit board on which a printed circuit and solid state components such as semiconductor chips as well as other components are mounted is shown and indicated generally by the reference numeral 21. In the above embodiment, the circuit board 21 comprises, as shown in FIG. 2, an aluminum (Al) substrate 22 of about 2–3 mm thickness, an insulating layer 23 of 75–100 μm thickness made of, for example, epoxy resin, and a conductor pattern 24 of a copper (Cu) film on the insulating layer 23.

The conductor pattern 24 is coated with the solder resist 25, which is patterned to be opened to form a land pattern 26 in the position where a semiconductor chip will be mounted.

A semiconductor bare chip 27 is jointed directly by solder (eutectic solder or lead-free solder) 28 onto the conductor pattern 24 being exposed in the land pattern 26. The semiconductor bare chip 27 is, for example, a bare chip of power devices such as electric power diodes or power transistors for power conversion, through which a large amount of electric current flows. Because of the large current flowing through the conductive pattern 24, the cross-sectional area of the pattern is thickened. A thickness of between 300 to 500 μm is chosen. That normally used with bare chips is in the order of 75 to 105 μm in thickness.

In the present invention, when the semiconductor chip is soldered, the amount of the solder used is the one sufficient for the whole chip bottom surface to be covered. The excess the molten solder can flow out in the middle of escapes formed in the land pattern. Thus, the effects of the land pattern constitution of the invention of the above can be gained by appropriately selecting the amount of the solder.

After being soldered, the semiconductor bare chip 27 is sealed or potted by resin 29 such as epoxy having particular thermal expansion characteristics. The linear thermal expansion coefficient of the resin 29 is approximately equal to that of the conductive pattern 28. In this case copper which has a linear thermal expansion coefficient of $16.7 \times 10^{-6}$/° C. Therefore, matching the linear expansion coefficient of the epoxy resin 29 with that of the conductive pattern 28 allows to effectively reduce the thermal stress generated by the temperature cycling acting on the semiconductor bare chip 27. This has been empirically confirmed.

In this connection, the linear expansion coefficient of the aluminum substrate 22 is $23 \times 10^{-6}/°$ C. Alternatively, a ceramic substrate (linear expansion coefficient=$2.4 \times 10^{-6}/°$ C.) or an iron substrate (linear expansion coefficient=about $12 \times 10^{-6}/°$ C.) may be adopted. In either case, the linear expansion coefficient of the resin 29 should be adjusted to be approximately equal to that of copper used to constitute the conductive pattern 28.

Figures 3, 4:
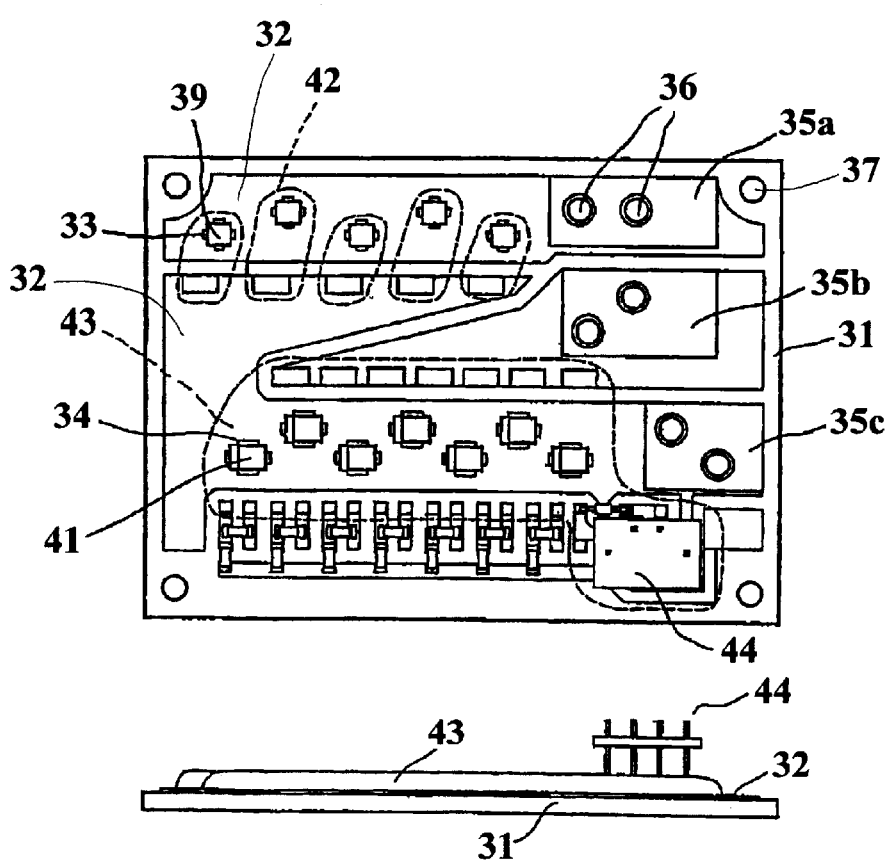
FIG. 3 is a top plan view, in part similar to FIG. 2, but showing the chips and other components mounted on the aluminum substrate.
FIG. 4 is a side elevational view of the structure shown in FIG. 3.
Figure 5:
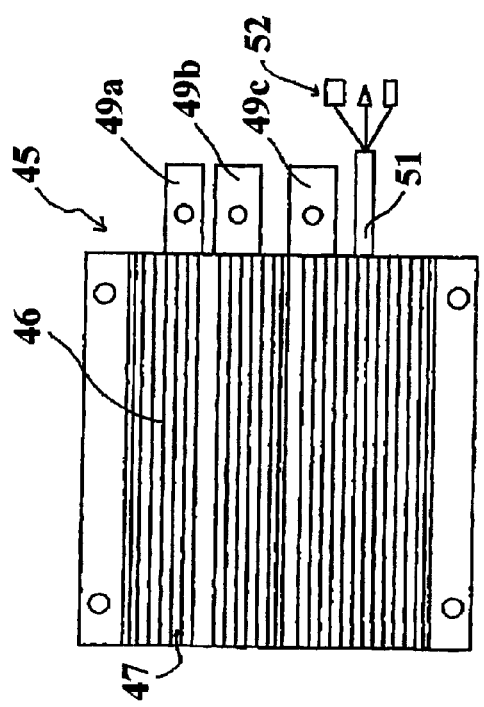
FIG. 5 is top plan view of a motor control unit for an electric-powered vehicle incorporating the invention.
Figure 6:
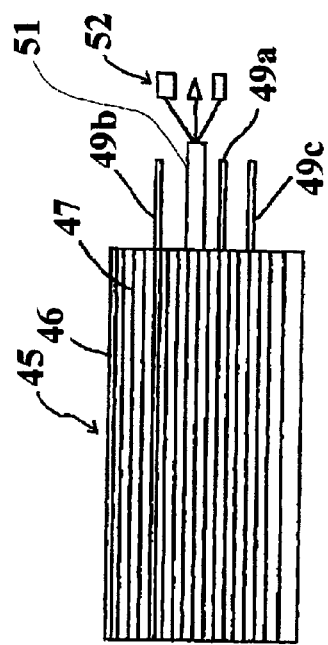
FIG. 6 is a side elevational view of the motor control unit.
Figure 7:
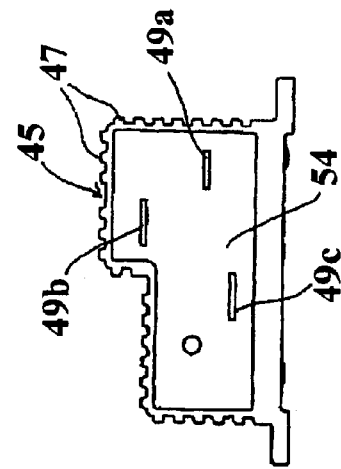
FIG. 7 is an end elevational view of the motor control unit.

FIGS. 2–4 show an embodiment where a substrate embodying the invention can be used as a motor control unit for driving an electric-powered vehicle. A conductor pattern of copper (not shown) is formed on an aluminum substrate 31 and coated with a resist 32. By patterning the resist 32, diode land patterns 33 and FET land patterns 34 constituting portions of a motor control circuit are formed. Output terminals 35a, 35b, and 35c of the control circuit are formed at three places on the aluminum substrate 31 each having two output terminal holes 36, respectively. At the four corners of the aluminum substrate 31 are disposed mounting holes 37 for fixing a casing body as will be described later by reference to FIGS. 7–12. Further on the substrate is provided a gate resistance 38 forming a further component of the drive circuit.

Diodes 39 are soldered within the respective diode land patterns 33, and FETs 41 are soldered within the respective FET land patterns 34. Each diode 39 is respectively sealed or potted with a resin 42. Each FET 41 is sealed with resin 43 along with a connector 44. A commercially available liquid sealing material or resin of linear expansion coefficient of (15 to 30)$\times 10^{-6}/°$ C. can be selected to use as the potting material for sealing such diodes 39 and FETs 41. (For example, sealing materials of linear expansion coefficient of $15 \times 10^{-6}/°$ C. and $22 \times 10^{-6}/°$ C. approximate to those of copper and aluminum respectively are easily available in the market.) Referring now to FIGS. 5–10, these figures show how a complete motor control unit incorporating the aluminum substrate 31 of FIGS. 2–4 can be constructed in accordance with a further feature of the invention. The motor control unit, indicated generally by the reference numeral, 45 includes a drive control circuit configured of the aluminum substrate 31 as previously described by reference to FIGS. 2–4 in a casing body 46.

The casing body 46 is formed by the extrusion of a metallic material of aluminum or aluminum alloy. The casing body 46 is of a cylindrical shape with both ends open. A plurality of aligned parallel ribs 47 are formed to project from its outer circumferential surface. The ribs 47 increase the surface area of the casing body 46, resulting in the increase of heat radiation as well as the rigidity and strength of the casing body 46.

Figure 8:
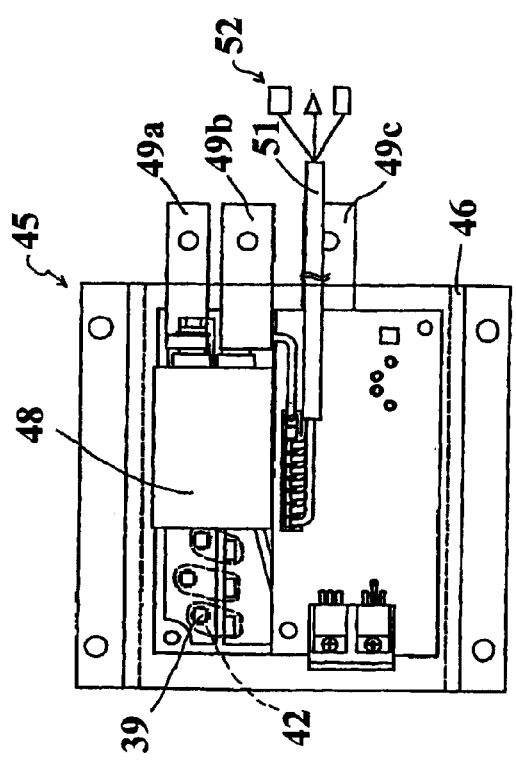
FIG. 8 is a top plan view in part similar to FIG. 5, but with the potting compound removed and showing the contained components in solid lines.
Figure 10:
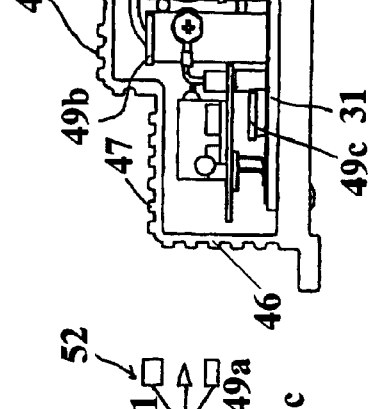
FIG. 10 is an end elevational view in part similar to FIG. 7, but with the potting compound removed and showing the contained components in solid lines.
Figure 9:
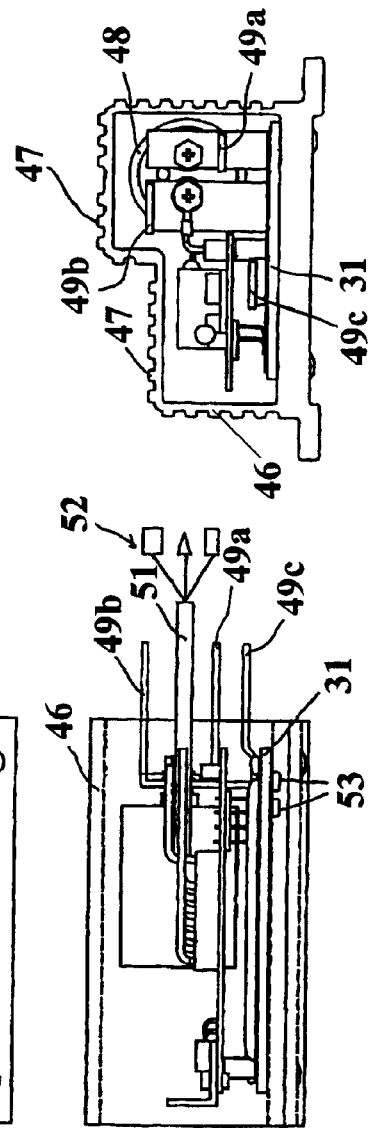
FIG. 9 is a side elevational view in part similar to FIG. 6, but with the potting compound removed and showing the contained components in solid lines.

On the aluminum substrate 31 are mounted further devices constituting a drive control circuit such as an electrolytic capacitor 48 constituting a drive control circuit (FIG. 8). Also terminal attaching plates 49a, 49b, and 49c are connecting to the aforementioned output terminals 35a, 35b, and 36c. Each signal wire of the control circuit is connected through an electric cable 51 and a coupler 52 to switches and other drive or control parts on the vehicle side. Output terminals 53 passing through the aforementioned output terminal holes 37 project from the lower surface of the aluminum substrate 31. Such an aluminum substrate 31 and the electronic parts mounted thereon are accommodated in the casing body 46 and sealed or potted with resin 54 having the aforenoted thermal expansion characteristics.

As described, by matching the linear expansion coefficient of the resin used to seal the semiconductor chips with that of the conductive pattern formed on the metal substrate reduces thermal stress and mechanical stress caused by the temperature cycling. This achieves improvement in its durability and prevention from deterioration with a simple configuration that does not require the use a heat sink. Of course the embodiment described is a preferred embodiment of the invention and various changes and modifications may be made without departing from the spirit and scope of the invention, as defined by the appended claims.

What is claimed is:

1. A circuit comprising a metal substrate, an insulating layer on said substrate, a conductive pattern formed on said insulating layer, a semiconductor bare chip mounted directly onto said conductive pattern, and a sealing body formed over said semiconductor bare chip, said sealing body being formed from a material having a thermal expansion coefficient approximately equal to that of said conductive pattern.

2. A circuit as set forth in claim 1 wherein the metal substrate comprises an aluminum substrate and the conductive pattern is formed of copper film.

3. A circuit as set forth in claim 1 in combination with a rotating electrical machine wherein the circuit is utilized for controlling electrical power of the rotating electrical machine.

4. The combination of claim 3 wherein the rotating machine control unit comprised of a cylindrical open ended casing body in which the circuit is contained, said casing body having outwardly projecting, parallel ribs protruding from the surface of said casing body, said circuit being held inside of said casing body by the resin.

* * * * *